(12) United States Patent
Ozawa et al.

(10) Patent No.: US 11,648,515 B2
(45) Date of Patent: May 16, 2023

(54) GAS SOLUTION MANUFACTURING DEVICE

(71) Applicant: EBARA CORPORATION, Tokyo (JP)

(72) Inventors: Suguru Ozawa, Tokyo (JP); Yuji Araki, Tokyo (JP); Yoichi Nakagawa, Tokyo (JP); Toshifumi Watanabe, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 193 days.

(21) Appl. No.: 17/164,026

(22) Filed: Feb. 1, 2021

(65) Prior Publication Data

US 2021/0245115 A1      Aug. 12, 2021

(30) Foreign Application Priority Data

Feb. 6, 2020   (JP) .............................. JP2020-019162

(51) Int. Cl.
*B01F 3/04* (2006.01)
*B01F 23/231* (2022.01)
(Continued)

(52) U.S. Cl.
CPC ........ *B01F 23/23124* (2022.01); *B01F 23/49* (2022.01); *B01F 23/803* (2022.01);
(Continued)

(58) Field of Classification Search
CPC ........ B01F 23/23124; B01F 23/231244; B01F 23/237613; B01F 23/483; B01F 23/49; B01F 23/803; B01F 25/31; B01F 25/312; B01F 33/82; B01F 35/2132; B01F 35/2213; B01F 35/602; B01F 35/7176; B01F 2101/48
(Continued)

(56) References Cited

U.S. PATENT DOCUMENTS 6,162,359 A * 12/2000 Andre .................... B01D 53/84
                                                               210/627
6,343,779 B1 * 2/2002 Morita ...................... B08B 3/08
                                                               261/DIG. 42
(Continued)

FOREIGN PATENT DOCUMENTS

| EP | 3 403 717 A1 | 11/2018 |
| JP | 2004-188246 A | 7/2004 |
| WO | 99/21798 A1 | 5/1999 |

*Primary Examiner* — Charles S Bushey
(74) *Attorney, Agent, or Firm* — Pearne & Gordon LLP

(57) ABSTRACT

A gas solution manufacturing device 1 includes a gas supply line 2 configured to supply a gas as a raw material of a gas solution, a liquid supply line 3 configured to supply a liquid as a raw material of the gas solution, a gas solution production unit 4 configured to mix the gas and the liquid together to produce the gas solution, a gas-liquid separation unit 5 configured to perform gas-liquid separation of the produced gas solution into a supplied liquid to be supplied to a use point and a discharged gas to be discharged through an exhaust port, and a gas dissolving unit 6 provided in the liquid supply line 4 and configured to dissolve the discharged gas resulting from the gas-liquid separation in the liquid. The gas dissolving unit 6 is configured with a hollow fiber membrane configured with a gas permeable membrane.

8 Claims, 8 Drawing Sheets

(51) Int. Cl.
*B01F 23/40* (2022.01)
*B01F 23/80* (2022.01)
*B01F 25/31* (2022.01)
*B01F 35/60* (2022.01)
*B01F 35/21* (2022.01)
*B01F 35/221* (2022.01)
*B01F 35/71* (2022.01)
*B01F 23/237* (2022.01)
*B01F 101/48* (2022.01)

(52) U.S. Cl.
CPC .......... *B01F 25/31* (2022.01); *B01F 35/2132* (2022.01); *B01F 35/2213* (2022.01); *B01F 35/602* (2022.01); *B01F 35/7176* (2022.01); *B01F 23/231244* (2022.01); *B01F 23/237613* (2022.01); *B01F 23/483* (2022.01); *B01F 2101/48* (2022.01)

(58) Field of Classification Search
USPC .............................. 261/21, 76, 104, DIG. 42
See application file for complete search history.

(56) References Cited

U.S. PATENT DOCUMENTS

| | | | |
|---|---|---|---|
| 8,403,305 B2 * | 3/2013 | Matsumura | B01F 33/05 |
| | | | 261/118 |
| 9,150,443 B2 * | 10/2015 | Hengsperger | B01D 19/0057 |
| 11,352,274 B2 * | 6/2022 | Ozawa | C02F 1/008 |
| 2010/0219137 A1 * | 9/2010 | Lacasse | C02F 9/00 |
| | | | 210/151 |
| 2017/0333850 A1 | 11/2017 | Sabelfeld et al. | |
| 2019/0262784 A1 * | 8/2019 | Nakagawa | B01F 35/2209 |

* cited by examiner

GAS SOLUTION MANUFACTURING DEVICE

BACKGROUND OF THE INVENTION

Field of the Invention

The present invention relates to a gas solution manufacturing device that mixes a gas and a liquid as raw materials of a gas solution together and produces a gas solution.

Description of the Related Art

In recent years, a washing method for electronic components such as semiconductor devices and liquid crystals in a manufacturing plant has been increasingly upgraded in response to complication of a manufacturing process and miniaturization of a circuit pattern. In general, in washing of a silicon wafer, a special washing liquid (gas solution) in which a high purity gas is dissolved in a liquid referred to as functional water (for example, pure water) is used to remove fine particles, metal contamination, organic contamination, and so forth, which are adhered to the silicon wafer.

A gas solution used for washing such as ozonated water is manufactured by a gas solution manufacturing device and supplied to a use point such as a washing device. In the gas solution manufacturing device, a gas (ozone gas) and a liquid (pure water) as raw materials of the gas solution are mixed together in a gas dissolving unit (ozone dissolving means), and the gas solution (ozonated water) is thereby produced. The produced gas solution is subjected to gas-liquid separation in a gas-liquid separation unit and separated into a supplied liquid to be supplied to the use point and a discharged gas to be discharged through an exhaust port.

In related art, it has been desired to reuse this discharged gas (the gas which is not dissolved in the gas solution). Accordingly, in related art, an ozonated water manufacturing system has been suggested in which another gas dissolving unit (other ozone dissolving means) is provided in a supply line (on a downstream side of the gas dissolving unit) to the use point and undissolved ozone gas is reused (for example, see Japanese Patent Laid-Open No. 2004-188246).

An ozonated water manufacturing system in related art has a problem that another gas dissolving unit (other ozone dissolving means) is provided in a supply line (on a downstream side of a gas dissolving unit) to a use point, but because a dissolution concentration of ozone gas is high on the downstream side of the gas dissolving unit, it is difficult to further dissolve ozone gas in the other gas dissolving unit, that is, it is difficult to produce ozonated water at a high concentration.

The present invention has been made in consideration of the above problem, and an object is to provide a gas solution manufacturing device that easily produces a gas solution at a high concentration by reusing a gas which is not dissolved in a gas solution.

SUMMARY OF THE INVENTION

A gas solution manufacturing device of the present invention includes: a gas supply line configured to supply a gas as a raw material of a gas solution; a liquid supply line configured to supply a liquid as a raw material of the gas solution; a gas solution production unit configured to mix the gas and the liquid together to produce the gas solution; a gas-liquid separation unit configured to perform gas-liquid separation of the produced gas solution into a supplied liquid to be supplied to a use point and a discharged gas to be discharged through an exhaust port; and a gas dissolving unit provided in the liquid supply line and configured to dissolve the discharged gas resulting from the gas-liquid separation in the liquid, in which the gas dissolving unit is configured with a hollow fiber membrane configured with a gas permeable membrane.

In this configuration, the gas supplied from the gas supply line and the liquid supplied from the liquid supply line are mixed together in the gas solution production unit, the gas solution is thereby produced, and the gas-liquid separation into the supplied liquid to be supplied to the use point and the discharged gas to be discharged through the exhaust port is performed in the gas-liquid separation unit. The discharged gas (the gas which is not dissolved in the gas solution) is dissolved in the liquid as the raw material of the gas solution in the gas dissolving unit provided in the liquid supply line (on an upstream side of the gas solution production unit). As described above, it becomes possible to reuse the discharged gas (the gas which is not dissolved in the gas solution) in the liquid supply line (on the upstream side of the gas solution production unit). In this case, because the gas dissolving unit is configured with the hollow fiber membrane configured with the gas permeable membrane, it is possible to supply the gas at a lower pressure than a pressure of the liquid in a state where the gas and the liquid are isolated from each other by a membrane (the hollow fiber membrane configured with the gas permeable membrane), and the discharged gas can efficiently be dissolved in the liquid. This facilitates production of a gas solution at a high concentration by reusing the gas which is not dissolved in the gas solution.

Further, in the gas solution manufacturing device of the present invention, the liquid supply line may be provided with a booster pump configured to raise a pressure of the liquid to be supplied to the gas solution production unit, and the gas dissolving unit may be provided on a downstream side of the booster pump in the liquid supply line.

In this configuration, because the gas dissolving unit is provided on the downstream side (subsequent stage) of the booster pump, the pressure of the liquid to be supplied to the gas dissolving unit becomes high. Thus, a pressure of the discharged gas to be supplied to the gas dissolving unit becomes lower than the pressure of the liquid, and the discharged gas can easily be dissolved in the liquid in the gas dissolving unit.

Further, in the gas solution manufacturing device of the present invention, the liquid supply line may be provided with a booster pump configured to raise a pressure of the liquid to be supplied to the gas solution production unit, the gas dissolving unit may be provided on an upstream side of the booster pump in the liquid supply line, and a pressure adjustment unit configured to lower a pressure of the discharged gas resulting from the gas-liquid separation may be provided between the gas dissolving unit and the gas-liquid separation unit.

In this configuration, in a case where the gas dissolving unit is provided on the upstream side (preceding stage) of the booster pump, the pressure of the discharged gas to be supplied to the gas dissolving unit is lowered by the pressure adjustment unit. Thus, it becomes possible to make the pressure of the discharged gas to be supplied to the gas dissolving unit become lower than the pressure of the liquid, and the discharged gas can efficiently be dissolved in the liquid in the gas dissolving unit.

Further, in the gas solution manufacturing device of the present invention, a pressure of the discharged gas to be supplied to the gas dissolving unit may be set to be lower than a pressure of the liquid to be supplied to the gas dissolving unit.

In this configuration, because the pressure of the discharged gas to be supplied to the gas dissolving unit is set to be lower than the pressure of the liquid, the discharged gas can be diffused and dissolved in the gas dissolving unit, and the gas solution with no bubble can be produced.

Further, the gas solution manufacturing device of the present invention may include: a delivery line configured to deliver the supplied liquid from the gas-liquid separation unit to the use point; and a drain line provided in a branching manner from the delivery line and being connected with a drain port, in which a dilution line configured to supply a dilution liquid for diluting the supplied liquid may be connected with the drain line and the dilution line may be provided with a flow amount adjustment unit configured to adjust a flow amount of the dilution liquid.

In this configuration, in a case where the supplied liquid is not used in the use point and is drained through the drain port, the supplied liquid (the gas solution at a high concentration) is diluted with the dilution liquid, and an influence on a facility, an environment, and so forth can thereby be reduced. In this case, because the flow amount adjustment unit is provided in the dilution line, the flow amount of the dilution liquid can appropriately be adjusted.

Further, in the gas solution manufacturing device of the present invention, the flow amount adjustment unit may adjust the flow amount of the dilution liquid in accordance with a flow amount of the supplied liquid to be delivered to the drain line.

In this configuration, the flow amount of the dilution liquid can appropriately be adjusted in accordance with the flow amount of the supplied liquid (the gas solution at a high concentration) to be delivered to the drain line.

Further, in the gas solution manufacturing device of the present invention, the drain line may be provided with a concentration measurement unit configured to measure a concentration of the supplied liquid to be delivered to the drain port, and the flow amount adjustment unit may adjust the flow amount of the dilution liquid in accordance with the concentration of the supplied liquid, the concentration being measured by the concentration measurement unit.

In this configuration, the flow amount of the dilution liquid can appropriately be adjusted in accordance with the concentration of the supplied liquid (the gas solution at a high concentration) to be delivered to the drain port.

Further, in the gas solution manufacturing device of the present invention, a pressure release valve may be provided in the drain line, the concentration measurement unit may be provided on a downstream side of the pressure release valve, and the dilution line may be connected with the drain line on the downstream side of the pressure release valve.

In this configuration, the flow amount of the dilution liquid is adjusted in accordance with the concentration of the supplied liquid (the gas solution at a high concentration), the concentration being measured on the downstream side of the pressure release valve, and the supplied liquid (the gas solution at a high concentration) is diluted on the downstream side of the pressure release valve. In this case, because dilution is performed on the downstream side of the pressure release valve (the dilution liquid is caused to flow into the supplied liquid whose pressure is released), the pressure of the dilution liquid does not have to be raised.

Further, in the gas solution manufacturing device of the present invention, a pressure release valve may be provided in the drain line, the concentration measurement unit may be provided on an upstream side of the pressure release valve, the dilution line may be connected with the drain line on the upstream side of the pressure release valve, and the dilution line may be provided with a booster pump.

In this configuration, the flow amount of the dilution liquid is adjusted in accordance with the concentration of the supplied liquid (the gas solution at a high concentration), the concentration being measured on the upstream side of the pressure release valve, and the supplied liquid (the gas solution at a high concentration) is diluted on the upstream side of the pressure release valve. In this case, because the concentration of the supplied liquid is measured on the upstream side of the pressure release valve (in a state where bubbles due to an influence of pressure release are not produced in the supplied liquid), the concentration of the supplied liquid can accurately be measured. Consequently, the flow amount of the dilution liquid can appropriately be adjusted in accordance with the concentration of the supplied liquid.

The present invention facilitates production of a gas solution at a high concentration by reusing a gas which is not dissolved in a gas solution.

DETAILED DESCRIPTION OF THE PREFERRED EMBODIMENTS

Gas solution manufacturing devices of embodiments of the present invention will hereinafter be described with reference to drawings. In this embodiment, a description will be made about, as an example, a case of a gas solution manufacturing device (ozonated water manufacturing device) used for manufacturing or the like of ozonated water used in a manufacturing process of electronic components such as semiconductor devices and liquid crystals.

First Embodiment

Figure 1:
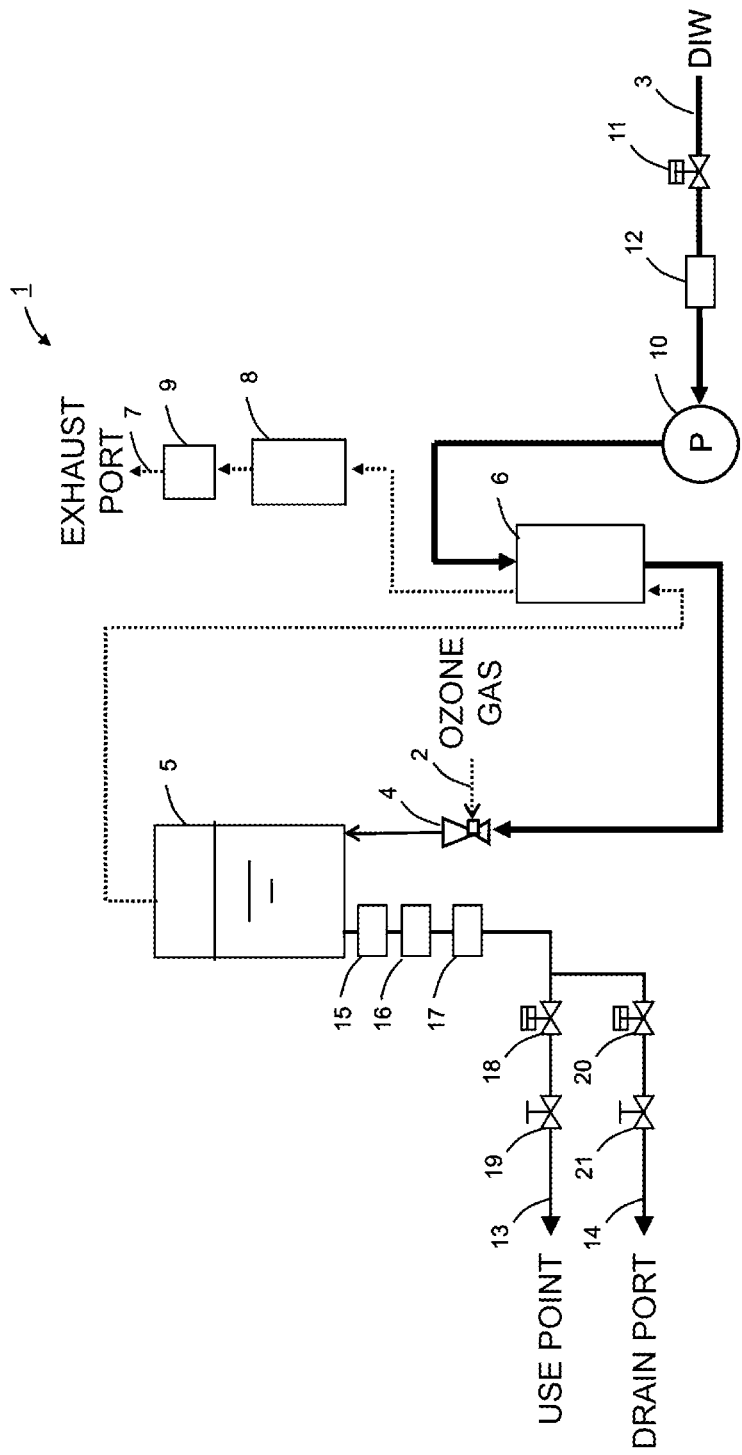
FIG. 1 is an explanatory diagram of an ozonated water manufacturing device in a first embodiment of the present invention.

A configuration of an ozonated water manufacturing device of a first embodiment of the present invention will be described with reference to the drawings. FIG. 1 is an explanatory diagram of the ozonated water manufacturing device of this embodiment. As illustrated in FIG. 1, an ozonated water manufacturing device 1 includes a gas supply line 2 for supplying a gas (ozone gas) as a raw material of ozonated water, a liquid supply line 3 for supplying a liquid (raw material water such as pure water) as a raw material of ozonated water, and an ozonated water production unit 4 for mixing ozone gas and the raw material water together to produce a gas solution (ozonated water).

The ozonated water production unit 4 is configured with a gas dissolving nozzle. As the gas dissolving nozzle, for example, an ejector or an aspirator may be used. The ejector and the aspirator can dissolve ozone gas in pure water by using the Venturi effect.

Further, as illustrated in FIG. 1, the ozonated water manufacturing device 1 includes a gas-liquid separation unit 5 for performing gas-liquid separation of the produced ozone water into a supplied liquid (ozonated water) to be supplied to a use point and a discharged gas (ozone gas) to be discharged through an exhaust port and an ozone gas dissolving unit 6 provided in the liquid supply line 3 and dissolving discharged ozone gas resulting from the gas-liquid separation in the raw material water. The ozone gas dissolving unit 6 is configured with a hollow fiber membrane configured with a gas permeable membrane.

The ozonated water manufacturing device 1 includes an exhaust line 7 for delivering the discharged gas (ozone gas) from the ozone gas dissolving unit 6 to the exhaust port. The exhaust line 7 is provided with a decomposition catalyst 8 for decomposing the discharged gas (ozone gas) and a pressure adjustment unit 9 for adjusting a pressure of the discharged gas (ozone gas).

Further, the liquid supply line 3 is provided with a booster pump 10 for raising a pressure of the raw material water to be supplied to the gas dissolving nozzle. Further, the liquid supply line 3 is provided with an air-driven valve 11 and a flow meter 12. The ozone gas dissolving unit 6 is provided on a downstream side of the booster pump 10 in the liquid supply line 3. Further, a pressure of discharged ozone gas to be supplied to the ozone gas dissolving unit 6 is set to be lower than the pressure of the raw material water to be supplied to the ozone gas dissolving unit 6.

In addition, as illustrated in FIG. 1, the ozonated water manufacturing device 1 includes a delivery line 13 for delivering ozonated water from the gas-liquid separation unit 5 to the use point and a drain line 14 provided in a branching manner from the delivery line 13 and connected with a drain port. The delivery line 13 is provided with a concentration meter 15, a pressure sensor 16, and a flow meter 17. Further, the delivery line 13 is provided with an air-driven valve 18 and a manual valve 19. In addition, the drain line 14 is provided with an air-driven valve 20 and a manual valve 21.

In such an ozonated water manufacturing device 1 of the first embodiment, ozone gas supplied from the gas supply line 2 and the raw material water supplied from the liquid supply line 3 are mixed together in the gas dissolving nozzle, ozonated water is thereby produced, and the gas-liquid separation into ozonated water to be supplied to the use point and the discharged ozone gas to be discharged through the exhaust port is performed in the gas-liquid separation unit 5. The discharged ozone gas (ozone gas which is not dissolved in ozonated water) is dissolved in the raw material water as the raw material of ozonated water in the ozone gas dissolving unit 6 provided in the liquid supply line 3 (on an upstream side of the gas dissolving nozzle). As described above, it becomes possible to reuse the discharged ozone gas (ozone gas which is not dissolved in ozonated water) in the liquid supply line 3 (on the upstream side of the gas dissolving nozzle).

In this case, because the ozone gas dissolving unit 6 is configured with the hollow fiber membrane configured with the gas permeable membrane, it is possible to supply ozone gas at a lower pressure than the pressure of the raw material water in a state where ozone gas and the raw material water are isolated from each other by a membrane (the hollow fiber membrane configured with the gas permeable membrane), and the discharged ozone gas can efficiently be dissolved in the raw material water. This facilitates production of ozonated water at a high concentration by reusing ozone gas which is not dissolved in ozonated water.

In this embodiment, because the ozone gas dissolving unit 6 is provided on the downstream side (subsequent stage) of the booster pump 10, the pressure of the raw material water to be supplied to the ozone gas dissolving unit 6 becomes high. Thus, the pressure of the discharged ozone gas to be supplied to the ozone gas dissolving unit 6 becomes lower than the pressure of the raw material water, and the discharged ozone gas can easily be dissolved in the raw material water in the ozone gas dissolving unit 6.

Further, in this embodiment, because the pressure of the discharged ozone gas to be supplied to the ozone gas dissolving unit 6 is set to be lower than the pressure of the raw material water, the discharged ozone gas can be diffused and dissolved in the ozone gas dissolving unit 6, and ozonated water with no bubble can be produced.

Modification Example 1

Figure 2:
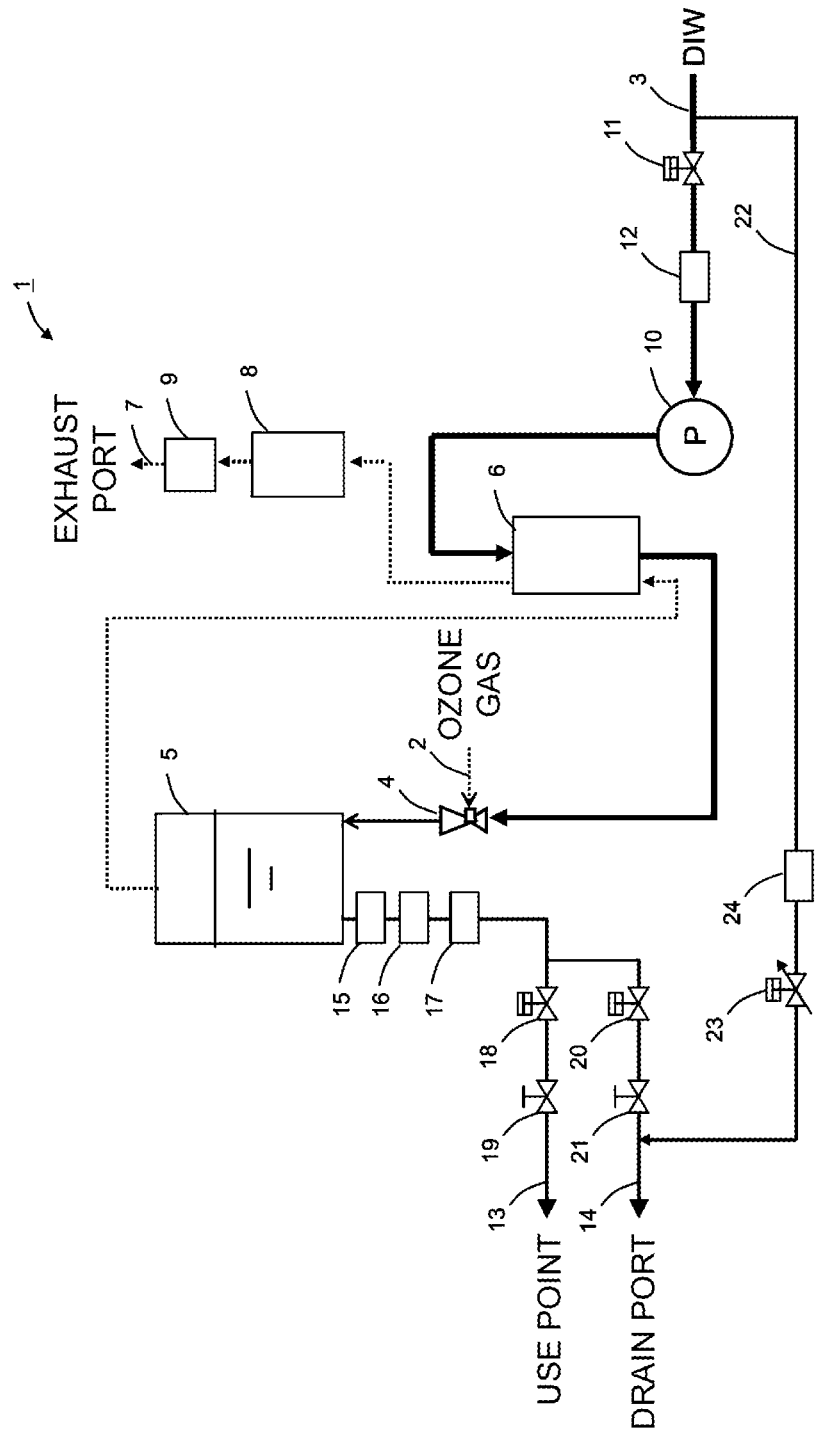
FIG. 2 is an explanatory diagram of a modification example 1 of the ozonated water manufacturing device in the first embodiment of the present invention.

FIG. 2 is a diagram illustrating a modification example 1 of the ozonated water manufacturing device 1 of the first embodiment. As illustrated in FIG. 2, in the modification example 1, a dilution line 22 is connected with the drain line 14, the dilution line 22 supplying a dilution liquid (pure water) for diluting ozonated water (ozonated water at a high concentration). The dilution line 22 is provided with a flow amount adjustment unit 23 for adjusting a flow amount of dilution pure water and a flow meter 24 for measuring the flow amount of the dilution pure water. The flow amount adjustment unit 23 is configured with an air-driven valve with a flow amount adjustment knob, for example, and the flow amount of the dilution pure water can manually be adjusted in accordance with a flow amount of ozonated water to be delivered to the drain line 14.

In such a modification example 1, in a case where ozonated water is not used in the use point and is drained through the drain port, ozonated water (ozonated water at a high concentration) is diluted with the dilution pure water, and an influence on a facility, an environment, and so forth can thereby be reduced. In this case, because the flow amount adjustment unit 23 is provided in the dilution line 22, the flow amount of the dilution pure water can appropriately be adjusted.

Further, in the modification example 1, the flow amount of the dilution pure water can appropriately be adjusted in accordance with the flow amount of ozonated water (ozonated water at a high concentration) to be delivered to the drain line 14.

Modification Example 2

Figure 3:
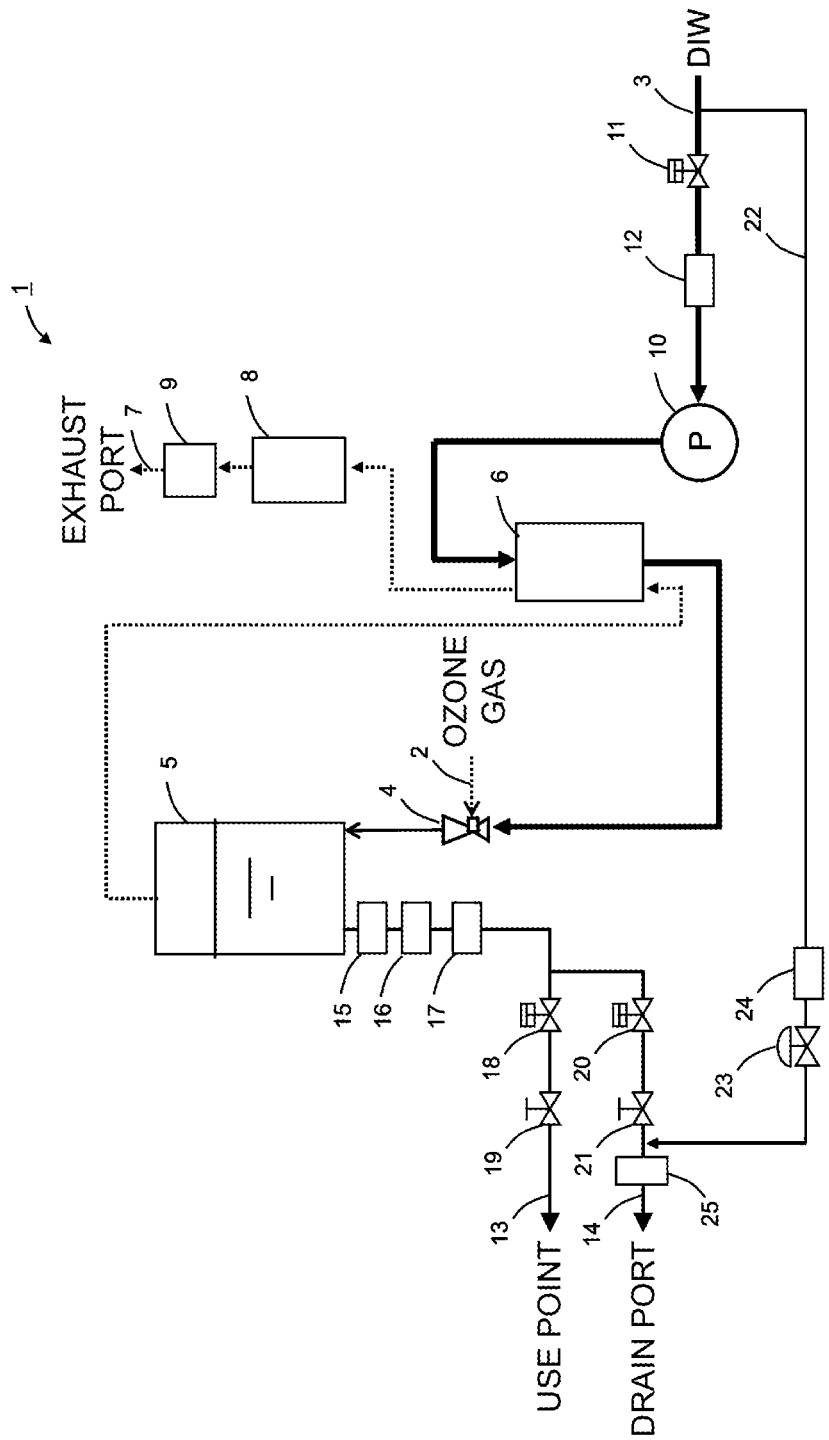
FIG. 3 is an explanatory diagram of a modification example 2 of the ozonated water manufacturing device in the first embodiment of the present invention.

FIG. 3 is a diagram illustrating a modification example 2 of the ozonated water manufacturing device 1 of the first embodiment. As illustrated in FIG. 3, in the modification example 2, a concentration measurement unit 25 for measuring a concentration of ozonated water to be delivered to the drain port is provided in the drain line 14. The flow amount adjustment unit 23 is configured with an electro-pneumatic regulator valve, for example, and can automatically adjust the flow amount of the dilution pure water in accordance with the concentration, of ozonated water, measured by the concentration measurement unit 25.

In this case, the manual valve 21 of the drain line 14 serves as a pressure release valve. The concentration measurement unit 25 is provided on a downstream side of the manual valve 21 (pressure release valve), and the dilution line 22 is connected with the drain line 14 on the downstream side of the manual valve 21 (pressure release valve).

In such a modification example 2, the flow amount of the dilution pure water can appropriately be adjusted in accordance with the concentration of ozonated water (ozonated water at a high concentration) to be delivered to the drain port.

Further, in the modification example 2, the flow amount of the dilution pure water is adjusted in accordance with the concentration of ozonated water (ozonated water at a high concentration), the concentration being measured on the downstream side of the manual valve 21 (pressure release valve), and ozonated water (ozonated water at a high concentration) is diluted on the downstream side of the manual valve 21 (pressure release valve). In this case, because dilution is performed on the downstream side of the manual valve 21 (pressure release valve) (the dilution pure water is caused to flow into the ozonated water whose pressure is released), the pressure of the dilution pure water does not have to be raised.

Modification Example 3

Figure 4:
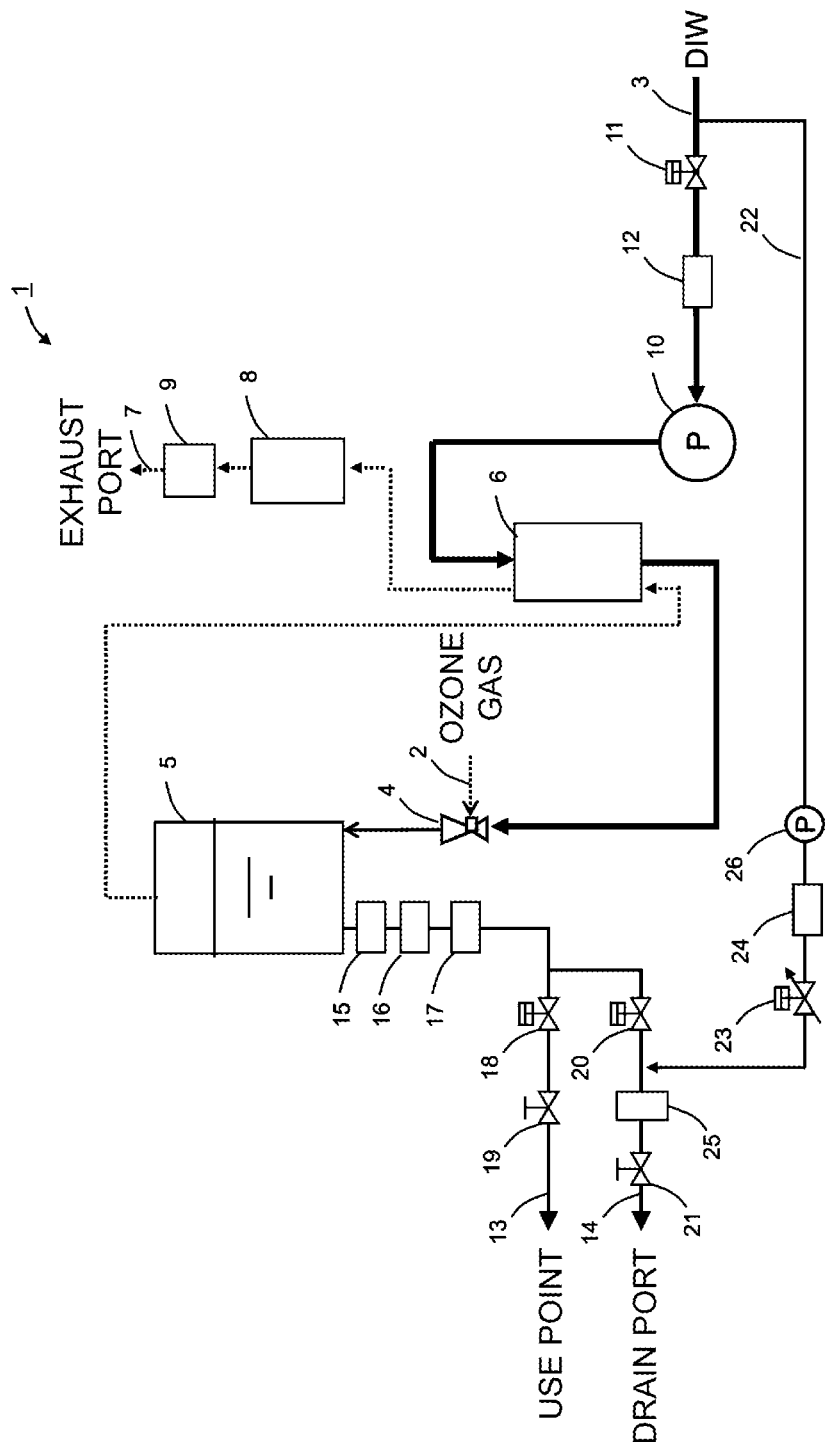
FIG. 4 is an explanatory diagram of a modification example 3 of the ozonated water manufacturing device in the first embodiment of the present invention.
Figure 5:
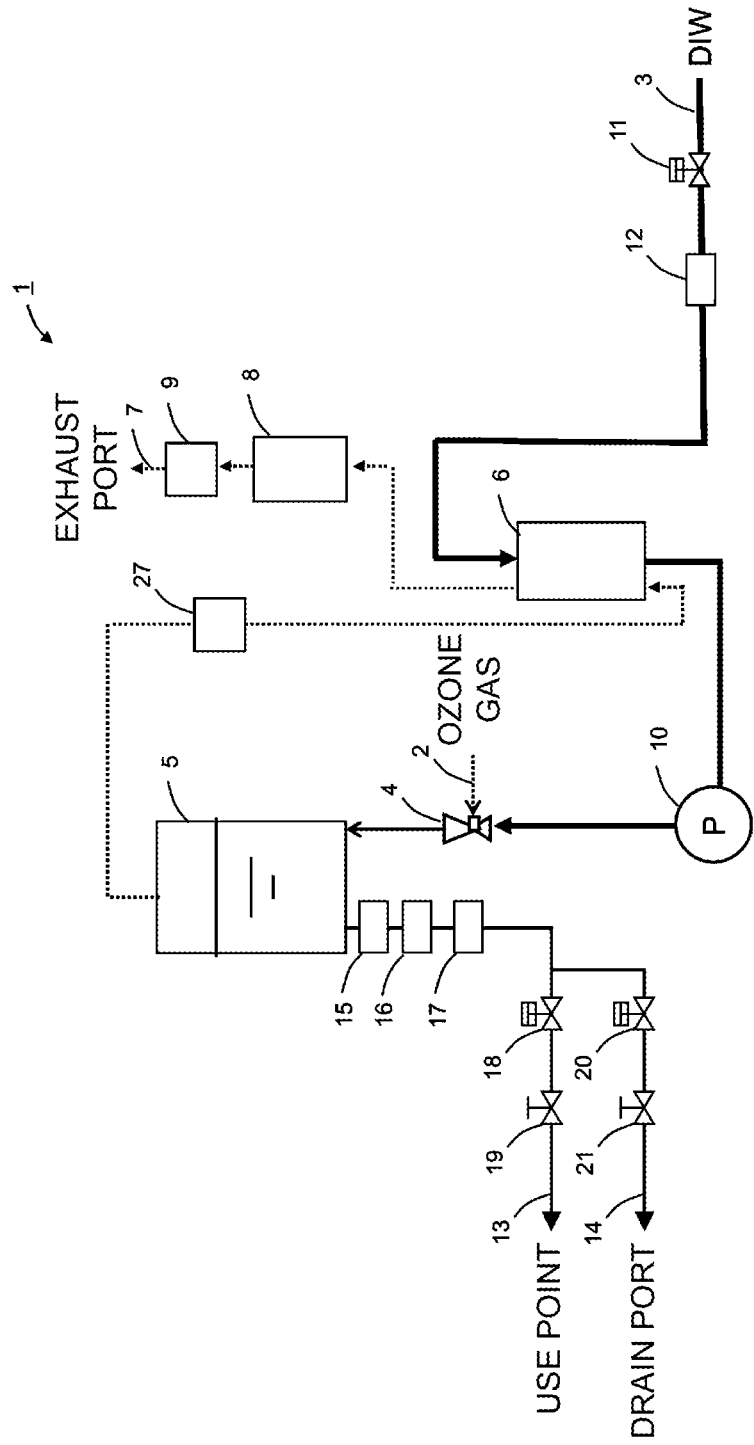
FIG. 5 is an explanatory diagram of an ozonated water manufacturing device in a second embodiment of the present invention.

FIG. 4 is a diagram illustrating a modification example 3 of the ozonated water manufacturing device 1 of the first embodiment. As illustrated in FIG. 4, in the modification example 3, the concentration measurement unit 25 is provided on an upstream side of the pressure release valve, and the dilution line 22 is connected with the drain line 14 on the upstream side of the pressure release valve. In this case, the dilution line 22 is provided with a booster pump 26 for raising the pressure of the dilution pure water. Further, the flow amount adjustment unit 23 is configured with an air-driven valve with a flow amount adjustment knob, for example, and the flow amount of the dilution pure water can manually be adjusted in accordance with the flow amount of ozonated water to be delivered to the drain line 14.

In such a modification example 3, the flow amount of the dilution pure water is adjusted in accordance with the concentration of ozonated water (ozonated water at a high concentration), the concentration being measured on the upstream side of the pressure release valve, and ozonated water (ozonated water at a high concentration) is diluted on the upstream side of the pressure release valve. In this case, because the concentration of ozonated water is measured on the upstream side of the pressure release valve (in a state where bubbles due to an influence of pressure release are not produced in ozonated water), the concentration of ozonated water can accurately be measured. Consequently, the flow amount of the dilution pure water can appropriately be adjusted in accordance with the concentration of ozonated water.

Second Embodiment

Next, a description will be made about the ozonated water manufacturing device 1 of a second embodiment of the present invention. Here, a description will mainly be made about the point in which the ozonated water manufacturing device 1 of the second embodiment is different from the first embodiment. Here, unless otherwise mentioned, a configuration and an operation of this embodiment are similar to the first embodiment.

In the second embodiment, the ozone gas dissolving unit 6 is provided on an upstream side of the booster pump 10 in the liquid supply line 3, and a pressure adjustment unit 27 for lowering the pressure of the discharged ozone gas resulting from the gas-liquid separation is provided between the ozone gas dissolving unit 6 and the gas-liquid separation unit 5.

Such an ozonated water manufacturing device 1 of the second embodiment also provides similar work and effects to the first embodiment.

That is, ozone gas supplied from the gas supply line 2 and the raw material water supplied from the liquid supply line 3 are mixed together in the gas dissolving nozzle, ozonated water is thereby produced, and the gas-liquid separation into ozonated water to be supplied to the use point and the discharged ozone gas to be discharged through the exhaust port is performed in the gas-liquid separation unit 5. The discharged ozone gas (ozone gas which is not dissolved in ozonated water) is dissolved in the raw material water as the raw material of ozonated water in the ozone gas dissolving unit 6 provided in the liquid supply line 3 (on the upstream side of the gas dissolving nozzle). As described above, it becomes possible to reuse the discharged ozone gas (ozone gas which is not dissolved in ozonated water) in the liquid supply line 3 (on the upstream side of the gas dissolving nozzle).

In this case also, because the ozone gas dissolving unit 6 is configured with the hollow fiber membrane configured with the gas permeable membrane, it is possible to supply ozone gas at a lower pressure than the pressure of the raw material water in a state where ozone gas and the raw material water are isolated from each other by the membrane (the hollow fiber membrane configured with the gas permeable membrane), and the discharged ozone gas can efficiently be dissolved in the raw material water. This facilitates production of ozonated water at a high concentration by reusing ozone gas which is not dissolved in ozonated water.

In this embodiment, in a case where the ozone gas dissolving unit 6 is provided on the upstream side (preceding stage) of the booster pump 10, the pressure of the discharged ozone gas to be supplied to the ozone gas dissolving unit 6 is lowered by the pressure adjustment unit 27. Thus, it becomes possible to make the pressure of the discharged ozone gas to be supplied to the ozone gas dissolving unit 6 become lower than the pressure of the raw material water, and the discharged ozone gas can efficiently be dissolved in the raw material water in the ozone gas dissolving unit 6.

Modification Example 1

Figure 6:
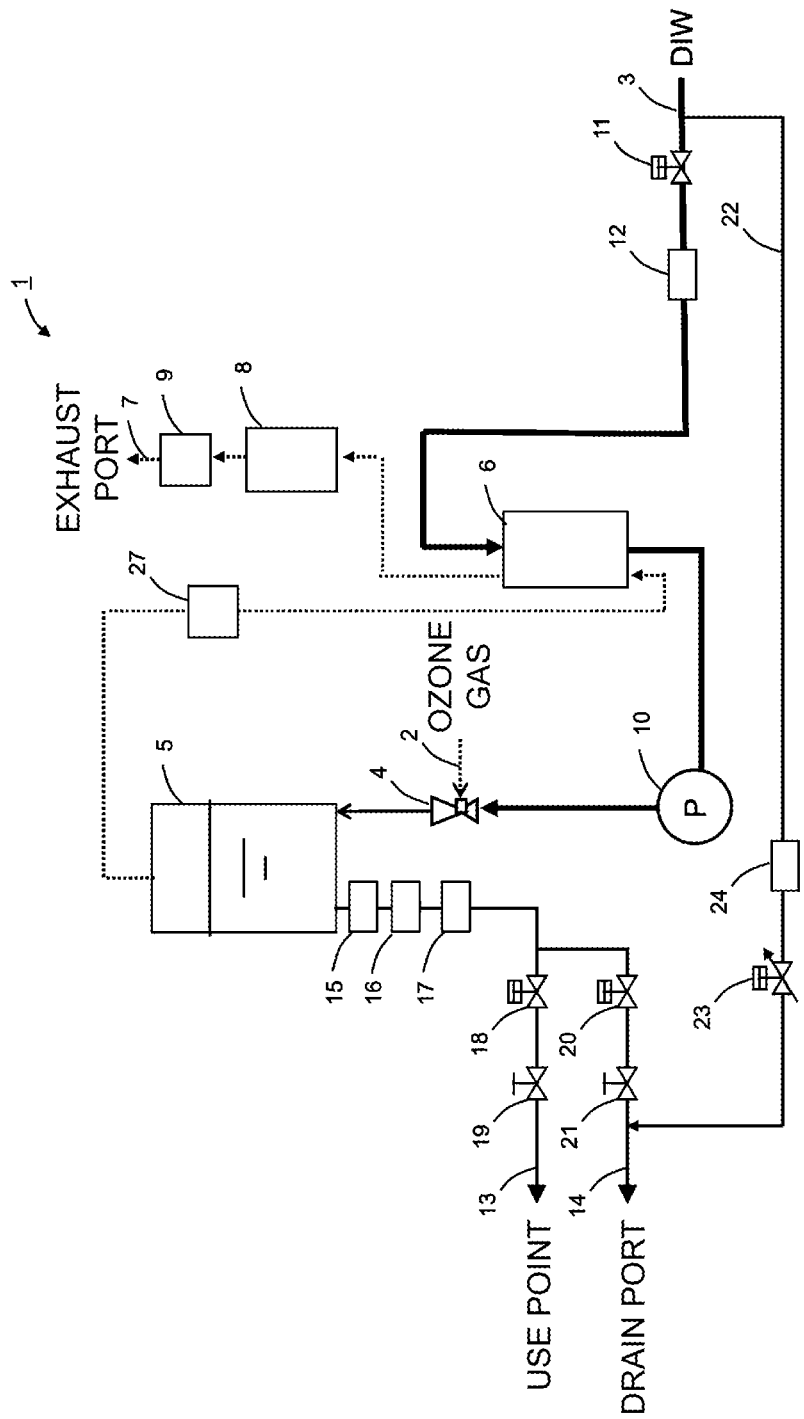
FIG. 6 is an explanatory diagram of a modification example 1 of the ozonated water manufacturing device in the second embodiment of the present invention.

FIG. 6 is a diagram illustrating a modification example 1 of the ozonated water manufacturing device 1 of the second embodiment. As illustrated in FIG. 6, in the modification example 1, the dilution line 22 is connected with the drain line 14, the dilution line 22 supplying the dilution liquid (pure water) for diluting ozonated water (ozonated water at a high concentration). The dilution line 22 is provided with the flow amount adjustment unit 23 for adjusting the flow amount of the dilution pure water and the flow meter 24 for measuring the flow amount of the dilution pure water. The flow amount adjustment unit 23 is configured with an air-driven valve with a flow amount adjustment knob, for example, and the flow amount of the dilution pure water can manually be adjusted in accordance with the flow amount of ozonated water to be delivered to the drain line 14.

In such a modification example 1, in a case where ozonated water is not used in the use point and is drained through the drain port, ozonated water (ozonated water at a high concentration) is diluted with the dilution pure water, and an influence on a facility, an environment, and so forth can thereby be reduced. In this case, because the flow amount adjustment unit 23 is provided in the dilution line 22, the flow amount of the dilution pure water can appropriately be adjusted.

Further, in the modification example 1, the flow amount of the dilution pure water can appropriately be adjusted in accordance with the flow amount of ozonated water (ozonated water at a high concentration) to be delivered to the drain line 14.

Modification Example 2

Figure 7:
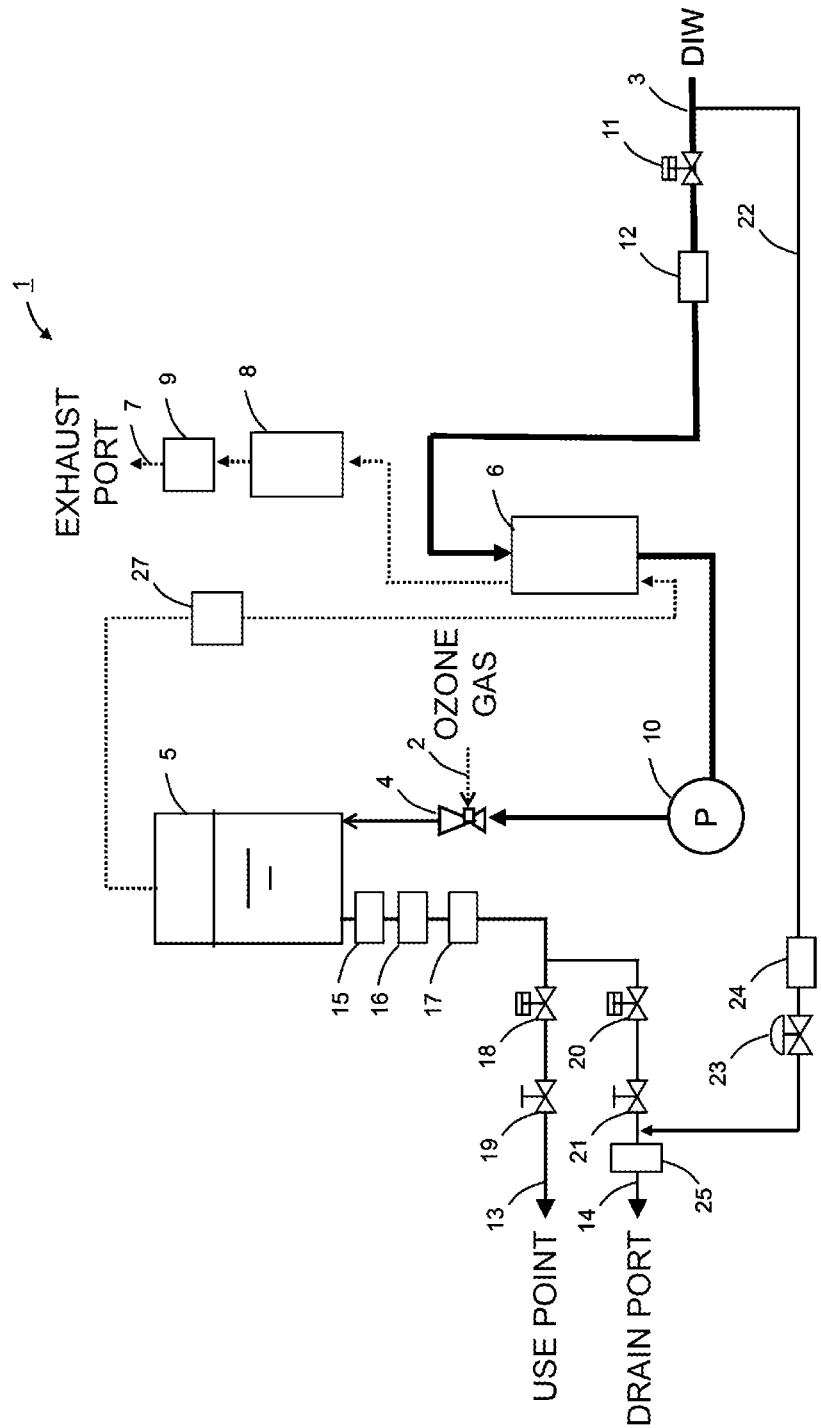
FIG. 7 is an explanatory diagram of a modification example 2 of the ozonated water manufacturing device in the second embodiment of the present invention.

FIG. 7 is a diagram illustrating a modification example 2 of the ozonated water manufacturing device 1 of the second embodiment. As illustrated in FIG. 7, in the modification example 2, the concentration measurement unit 25 for measuring the concentration of ozonated water to be delivered to the drain port is provided in the drain line 14. The flow amount adjustment unit 23 is configured with an electro-pneumatic regulator valve, for example, and can automatically adjust the flow amount of the dilution pure water in accordance with the concentration, of ozonated water, measured by the concentration measurement unit 25.

In this case, the manual valve 21 of the drain line 14 serves as a pressure release valve. The concentration measurement unit 25 is provided on the downstream side of the manual valve 21 (pressure release valve), and the dilution line 22 is connected with the drain line 14 on the downstream side of the manual valve 21 (pressure release valve).

In such a modification example 2, the flow amount of the dilution pure water can appropriately be adjusted in accordance with the concentration of ozonated water (ozonated water at a high concentration) to be delivered to the drain port.

Further, in the modification example 2, the flow amount of the dilution pure water is adjusted in accordance with the concentration of ozonated water (ozonated water at a high concentration), the concentration being measured on the downstream side of the manual valve 21 (pressure release valve), and ozonated water (ozonated water at a high concentration) is diluted on the downstream side of the manual valve 21 (pressure release valve). In this case, because dilution is performed on the downstream side of the manual valve 21 (pressure release valve) (the dilution pure water is caused to flow into the ozonated water whose pressure is released), the pressure of the dilution pure water does not have to be raised.

Modification Example 3

Figure 8:
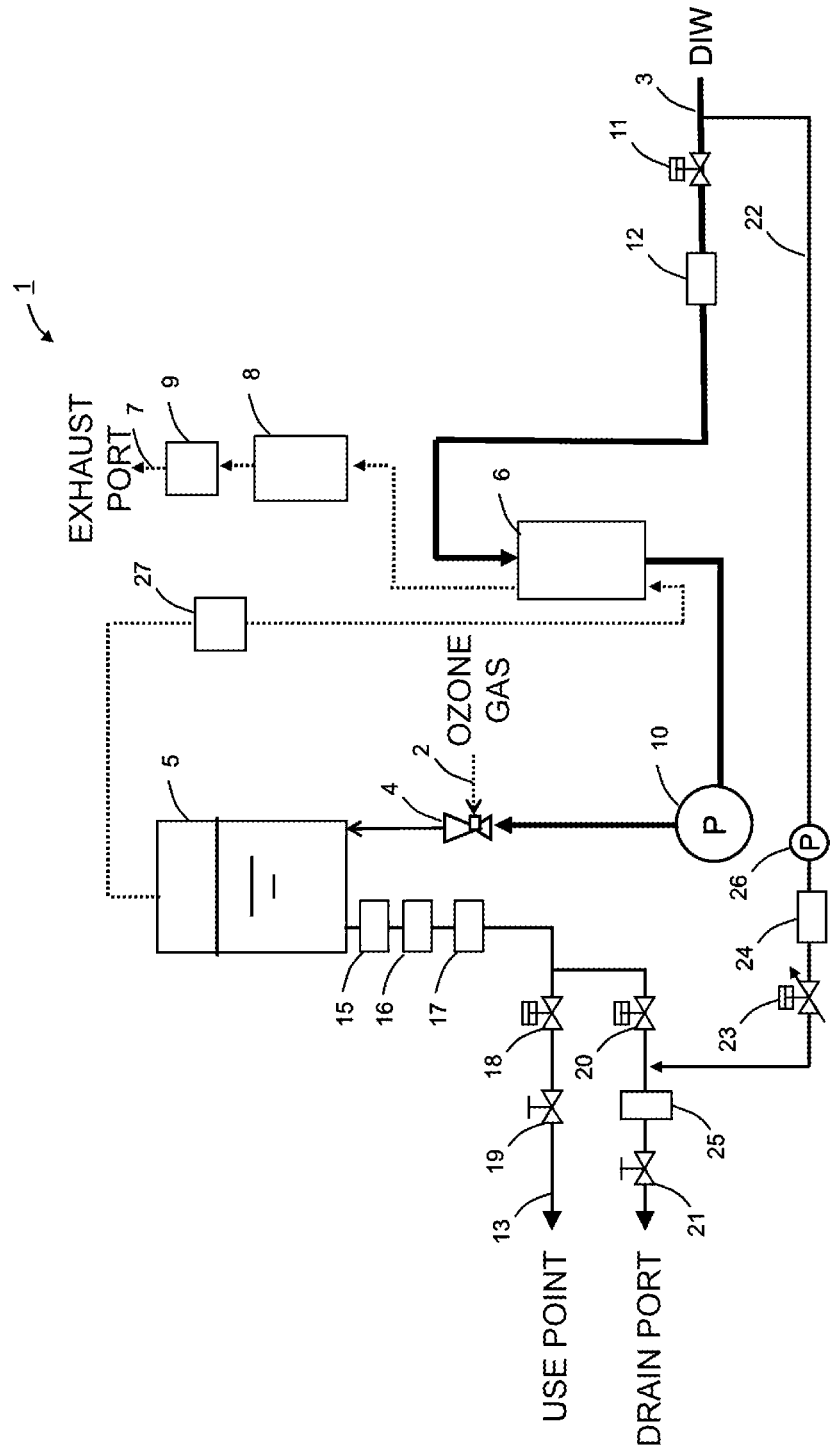
FIG. 8 is an explanatory diagram of a modification example 3 of the ozonated water manufacturing device in the second embodiment of the present invention.

FIG. 8 is a diagram illustrating a modification example 3 of the ozonated water manufacturing device 1 of the second embodiment. As illustrated in FIG. 8, in the modification example 3, the concentration measurement unit 25 is provided on the upstream side of the pressure release valve, and the dilution line 22 is connected with the drain line 14 on the upstream side of the pressure release valve. In this case, the dilution line 22 is provided with the booster pump 26 for raising the pressure of the dilution pure water. Further, the flow amount adjustment unit 23 is configured with an air-driven valve with a flow amount adjustment knob, for example, and the flow amount of the dilution pure water can manually be adjusted in accordance with the flow amount of ozonated water to be delivered to the drain line 14.

In such a modification example 3, the flow amount of the dilution pure water is adjusted in accordance with the concentration of ozonated water (ozonated water at a high concentration), the concentration being measured on the upstream side of the pressure release valve, and ozonated water (ozonated water at a high concentration) is diluted on the upstream side of the pressure release valve. In this case, because the concentration of ozonated water is measured on the upstream side of the pressure release valve (in a state where bubbles due to an influence of pressure release are not produced in ozonated water), the concentration of ozonated water can accurately be measured. Consequently, the flow amount of the dilution pure water can appropriately be adjusted in accordance with the concentration of ozonated water.

In the foregoing, the embodiments of the present invention have been described by giving examples. However, the scope of the present invention is not limited thereto, and it is possible to make variations and modifications in accordance with purposes within the scope of the claims.

As described above, a gas solution manufacturing device according to the present invention provides an effect of facilitating production of a gas solution at a high concentration by reusing a gas which is not dissolved in a gas solution, is applied to manufacturing or the like of ozonated water to be used for a manufacturing process of electronic components such as semiconductor devices and liquid crystals, and is useful.

REFERENCE SIGNS LIST

1 ozonated water manufacturing device (gas solution manufacturing device)
2 gas supply line
3 liquid supply line
4 ozonated water production unit (gas solution production unit)
5 gas-liquid separation unit
6 ozone gas dissolving unit (gas dissolving unit)
7 exhaust line
8 decomposition catalyst
9 pressure adjustment unit
10 booster pump
11 air-driven valve
12 flow meter
13 delivery line
14 drain line
15 concentration meter
16 pressure sensor
17 flow meter
18 air-driven valve
19 manual valve
20 air-driven valve
21 manual valve (pressure release valve)
22 dilution line
23 flow amount adjustment unit
24 flow meter
25 concentration measurement unit
26 booster pump
27 pressure adjustment unit

What is claimed is:

1. A gas solution manufacturing device comprising:
a gas supply line configured to supply a gas as a raw material of a gas solution;
a liquid supply line configured to supply a liquid as a raw material of the gas solution;
a gas solution production unit configured to mix the gas and the liquid together to produce the gas solution;
a gas-liquid separation unit configured to perform gas-liquid separation of the produced gas solution into a supplied liquid to be supplied to a use point and a discharged gas to be discharged through an exhaust port; and
a gas dissolving unit provided in the liquid supply line and configured to dissolve the discharged gas resulting from the gas-liquid separation in the liquid, wherein
the gas dissolving unit is configured with a hollow fiber membrane configured with a gas permeable membrane.

2. The gas solution manufacturing device according to claim 1, wherein
the liquid supply line is provided with a booster pump configured to raise a pressure of the liquid to be supplied to the gas solution production unit,
the gas dissolving unit is provided on an upstream side of the booster pump in the liquid supply line, and
a pressure adjustment unit configured to lower a pressure of the discharged gas resulting from the gas-liquid separation is provided between the gas dissolving unit and the gas-liquid separation unit.

3. The gas solution manufacturing device according to claim 1, wherein
a pressure of the discharged gas to be supplied to the gas dissolving unit is set to be lower than a pressure of the liquid to be supplied to the gas dissolving unit.

4. The gas solution manufacturing device according to claim 1, comprising:
a delivery line configured to deliver the supplied liquid from the gas-liquid separation unit to the use point; and
a drain line provided in a branching manner from the delivery line and being connected with a drain port, wherein
a dilution line configured to supply a dilution liquid for diluting the supplied liquid is connected with the drain line, and
the dilution line is provided with a flow amount adjustment unit configured to adjust a flow amount of the dilution liquid.

5. The gas solution manufacturing device according to claim 4, wherein
the flow amount adjustment unit adjusts the flow amount of the dilution liquid in accordance with a flow amount of the supplied liquid to be delivered to the drain line.

6. The gas solution manufacturing device according to claim 4, wherein
the drain line is provided with a concentration measurement unit configured to measure a concentration of the supplied liquid to be delivered to the drain port, and
the flow amount adjustment unit adjusts the flow amount of the dilution liquid in accordance with the concentration of the supplied liquid, the concentration being measured by the concentration measurement unit.

7. The gas solution manufacturing device according to claim 6, wherein
a pressure release valve is provided in the drain line,
the concentration measurement unit is provided on a downstream side of the pressure release valve, and
the dilution line is connected with the drain line on the downstream side of the pressure release valve.

8. The gas solution manufacturing device according to claim 6, wherein
a pressure release valve is provided in the drain line,
the concentration measurement unit is provided on an upstream side of the pressure release valve,
the dilution line is connected with the drain line on the upstream side of the pressure release valve, and
the dilution line is provided with a booster pump.

* * * * *